(12) United States Patent
Dreesen et al.

(10) Patent No.: US 12,333,357 B2
(45) Date of Patent: Jun. 17, 2025

(54) MEMORY BIT CELL FOR IN-MEMORY COMPUTATION

(71) Applicant: Apple Inc., Cupertino, CA (US)

(72) Inventors: Michael A. Dreesen, Austin, TX (US); Ajay Bhatia, Saratoga, CA (US); Michael R. Seningen, Austin, TX (US); Greg M. Hess, Mountain View, CA (US); Siddhesh Gaiki, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 988 days.

(21) Appl. No.: 17/317,844

(22) Filed: May 11, 2021

(65) Prior Publication Data

US 2022/0101914 A1 Mar. 31, 2022

Related U.S. Application Data

(60) Provisional application No. 63/083,824, filed on Sep. 25, 2020.

(51) Int. Cl.
| | |
|---|---|
| *G06G 7/16* | (2006.01) |
| *G06F 7/523* | (2006.01) |
| *G06F 17/16* | (2006.01) |
| *G11C 11/419* | (2006.01) |
| *G06F 7/544* | (2006.01) |

(52) U.S. Cl.
CPC ............... *G06G 7/16* (2013.01); *G06F 7/523* (2013.01); *G06F 17/16* (2013.01); *G11C 11/419* (2013.01); *G06F 7/5443* (2013.01)

(58) Field of Classification Search
CPC ........... G11C 7/10; G11C 7/1006; G11C 7/12; G11C 11/413; G11C 11/419; G06F 17/16; G06F 7/523; G06F 7/5443; G06F 9/3893; G06F 2207/4814; G06G 7/16

See application file for complete search history.

(56) References Cited

U.S. PATENT DOCUMENTS

| | | | |
|---|---|---|---|
| 10,042,608 B2 | 8/2018 | Tiwari | |
| 10,043,570 B1 | 8/2018 | Tiwari | |
| 10,777,253 B1 * | 9/2020 | Khaddam-Aljameh | ..................... G11C 11/5628 |
| 10,964,356 B2 * | 3/2021 | Wang | ..................... G11C 7/1063 |
| 11,455,371 B2 * | 9/2022 | Lee | ..................... G06N 3/063 |
| 11,538,509 B2 * | 12/2022 | Mirhaj | ..................... G11C 7/12 |
| 11,551,759 B2 * | 1/2023 | Teague | ..................... G06N 3/063 |
| 11,562,205 B2 * | 1/2023 | Wang | ..................... G06N 3/045 |
| 11,823,035 B2 * | 11/2023 | Srivastava | ..................... G11C 11/419 |
| 11,914,973 B2 * | 2/2024 | Nazar | ..................... G06N 3/065 |
| 2019/0102170 A1 | 4/2019 | Chen et al. | |
| 2019/0102359 A1 | 4/2019 | Knag et al. | |
| 2021/0005230 A1 * | 1/2021 | Wang | ..................... G11C 11/412 |

\* cited by examiner

*Primary Examiner* — Matthew D Sandifer
(74) *Attorney, Agent, or Firm* — Kowert, Hood, Munyon, Rankin & Goetzel, P.C.; Dean M. Munyon

(57) ABSTRACT

A compute-memory circuit included in a computer system may include multiple compute data storage cells coupled to a compute bit line via respective capacitors. The compute data storage cells may store respective bits of a weight value. During a multiply operation, an operand may be used to generate a voltage level on a compute word line that is used to store respective amounts of charge on the capacitors, which are coupled to the compute bit line. The voltage on the compute bit line may be converted into multiple bits whose value is indicative of a product of the operand and the weight value.

20 Claims, 14 Drawing Sheets

MEMORY BIT CELL FOR IN-MEMORY COMPUTATION

PRIORITY INFORMATION

This application claims the benefit of U.S. Provisional Application No. 63/083,824, filed on Sep. 25, 2020, which is incorporated by reference herein in its entirety.

BACKGROUND

Technical Field

Embodiments described herein relate to integrated circuits, and more particularly, to techniques for performing computation operations using memory circuits.

Description of the Related Art

Modern computer systems are being asked to perform increasingly complex tasks, such as language processing, image recognition, and the like. To handle such tasks, different classes of algorithms, such as machine learning algorithms, are being employed. Machine learning algorithms often rely on a set of training data from which a model is generated. The generated model is then used to perform a particular processing task, such as image recognition.

Executing machine learning algorithms can often result in repeatedly performing computation intensive operations, such as multiply and accumulate operations. These types of operation tend to not map well to conventional computer systems. For example, execution of these operations on systems that are based on processors or processor cores configured to execute software or program instructions often result in excessive power dissipation and undesirable performance. To improve the energy efficiency of machine learning algorithms, some computer systems employ in-memory computing techniques, in which a matrix to be operated upon is stored in a memory. The memory is accessed using operand data to activate multiple rows of the memory in parallel to generate a product of the operand and the stored matrix.

SUMMARY OF THE EMBODIMENTS

Various embodiments for performing a compute operation in a memory are disclosed. Broadly speaking, a sign data storage cell is configured to store a sign value associated with a weight value, and selectively couple, based on the sign value, either a compute word line or a complement compute word line to a compute select line. A given compute data storage cell of a plurality of compute data storage cells includes a capacitor and is configured to store a corresponding bit of the weight value, and couple, based on the corresponding bit and a voltage level of the compute select line, a respective amount of charge onto a compute bit line via the capacitor. A control circuit is configured to generate, using an operand value, respective voltage levels on the compute word line and the complement compute word line. An analog-to-digital converter circuit is configured to generate, based on a voltage level of the compute bit line, a plurality of output bits whose value is indicative of a product of the operand value and the weight value. By employing capacitors as a tightly-controlled low-variation phenomenon to control an amount of charge coupled onto to a bit line by a data storage cell during a multiplication operation, the performance of in-memory computation could be improved over implementations that rely on transistors to transfer charge onto the bit line.

BRIEF DESCRIPTION OF THE DRAWINGS

The following detailed description makes reference to the accompanying drawings, which are now briefly described.

DETAILED DESCRIPTION OF EMBODIMENTS

Figure 1:
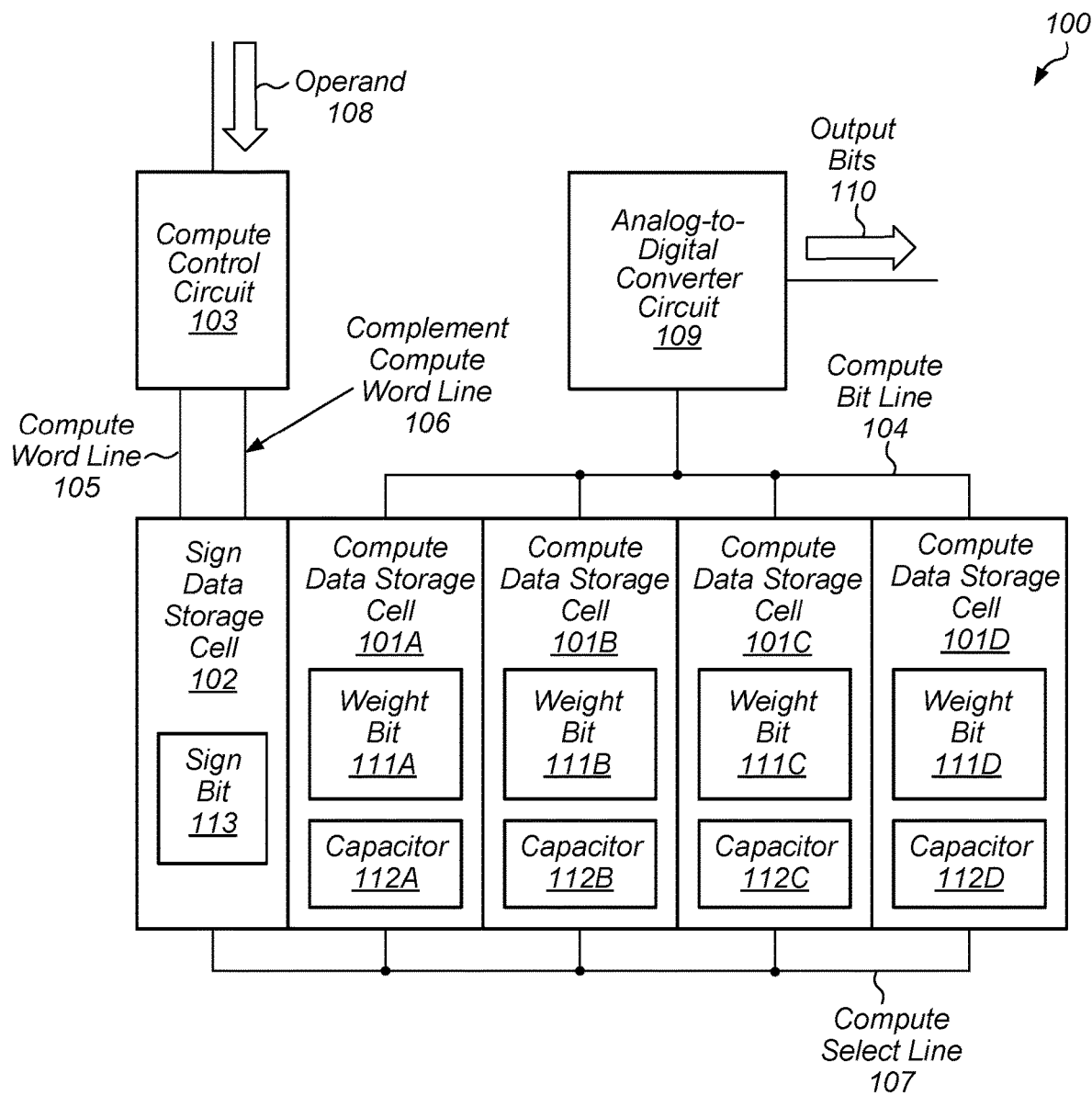
FIG. 1 is a block diagram of an embodiment of a compute-memory circuit.

As computer hardware and software continue to evolve, machine learning is increasingly being employed for certain types of computing tasks. As used and defined herein, machine learning is an application of artificial intelligence that provides computer systems the ability to learn and improve from experience without being explicitly programmed. For example, machine learning may be used in such areas as image processing and recognition, self-driving vehicles, natural language processing, and the like. Machine learning may, in various circumstances, employ a model developed from training data. The model is then used to analyze data associated with a particular application.

The algorithms used to implement machine learning do not always lend themselves to execution on conventional computer hardware. Machine learning algorithms can include many multiply-and-accumulate operations, which can result in high power consumption and poor performance on conventional computer hardware, which is not necessarily optimized for high-volume multiply-and-accumulated operations. To provide solutions for such multiply-and-accumulate operations that maintain performance while consuming less power, some computer systems employ in-memory computing techniques.

Rather than retrieving operands from memory and performing, using an arithmetic logic unit, repeated multiplications and additions, in-memory computation involves storing a matrix of numbers (often referred to as "weights") in a compute-memory circuit and operating on the matrix of numbers using circuits within the compute-memory circuit.

The compute-memory circuit may be implemented using static random-access memory (SRAM) storage cells, non-volatile memory storage cells, or any other suitable type of storage cell configured to store values indicative of a logic value.

Compute-memory circuits may employ a variety of techniques for performing a multiply-and-accumulate operation. In general, however, such techniques involve activating (or "reading") multiple rows within an array based on an operand value. Each activated row generates a product of a weight value stored in that row and a corresponding bit of the operand. The products generated by the activated rows are then added, in an analog fashion, on the bit lines of the compute-memory circuit.

Within an activated row, a given data storage cell will either sink a current or not sink a current from its associated bit line based on a value of the weight bit stored in the given data storage cell. For example, if the stored weight bit is a logical-1, then the given data storage cell may sink a small current from the associated bit line. Other data storage cells from other activated rows may also sink current from the bit line, generating a voltage level on the bit line corresponding to the sum of the individual products. The voltage level of the bit line can then be converted to a digital value using an analog-to-digital converter circuit.

Since the data storage cells in a compute-memory circuit are intended to have identical electrical characteristics, each data storage cell sinking a current from a bit line would sink a current of the same value. During the manufacture of an integrated circuit, devices intended to be identical often vary from instance to instance. Such variation may be the result in slight changes in lithography, differences in implantation of doping atoms into the devices, and the like. The variations can result in the currents sunk by different data storage cells being different, resulting in variation in the voltage level of the bit line for a particular sum. In order to account for such variation on the voltage on a bit line, accuracy and/or resolution of the sum need to be reduced.

The inventors have realized that by reducing the variability with a data storage cell, the variation in the voltage level on a bit line for a given sum could be reduced. Rather than relying on devices within the data storage cell, the inventors have determined that a capacitor, the characteristics of which are more tightly controlled during manufacture than transistors of other transconductance devices, could be used to control an amount of charge coupled onto to a bit line during a multiple operation. With more precise control of the amount of charge added (or subtracted) from the bit line, the variation of the voltage level of the bit line for a particular sum is reduced, improving the accuracy with which the final answer may be obtained.

The embodiments illustrated in the drawings and described below provide techniques for performing in-memory computation using data storage cells that employ capacitors to couple charge on to respective the bit lines instead of device currents. By using low-variation capacitors, variation in the voltage levels of the bit lines resulting from device current variation may be reduced and the accuracy of the in-memory computation may be improved.

A block diagram of a compute-memory circuit is depicted in FIG. 1. As illustrated, compute-memory circuit 100 includes compute data storage cells 101A-101D, sign data storage cell 102, compute control circuit 103, and analog-to-digital converter circuit 109.

Sign data storage cell 102 is configured to store sign value 113. In various embodiments, sign value 113 is associated with a weight value that includes weight bits 111A-111D, and denotes whether the weight value is positive or negative. For example, a sign value of "0" and a weight value of "0010" denotes a weight of "+2", while a sign value of "1" and a weight value of "0010" denotes a weight of "−2." Sign data storage cell 102 is further configured to couple, based on sign value 113, either compute word line 105 or complement compute word line 106 to compute select line 107. For example, if sign value 113 is "0" then complement compute word line 106 is coupled to compute select line 107. Alternatively, if sign value 113 is "1" then compute word line 105 is coupled to compute select line 107. As described below, the respective voltage levels on compute word line 105 and complement compute word line 106 may be selected, based on operand 108, from a predetermined set of voltage levels.

Compute data storage cells 101A-101D include capacitors 112A-112D, respectively, and are configured to store weight bits 111A-111D, respectively. Data storage cells 101A-101D are further configured to couple, based on a corresponding one of weight bits 111A-111D and a voltage level of compute select line 107, a respective amount of charge on compute bit line 104 via a corresponding one of capacitors 112A-112D. For example, if compute data storage cell 101A is storing a "1" then capacitor 112A will couple an amount of charge onto compute bit line 104. In various embodiments, the amount of charge coupled onto compute bit line 104 may be based on the voltage level of compute select line 107.

Since the variation of the capacitor is less than that of devices included in data storage cells 101A-101D, the amount of charge coupled to compute bit line 104 varies less than read currents of data storage cells 101A-101D. It is noted that although five weight bits with an associated sign bit are depicted in the embodiment of FIG. 1, in other embodiments, different number of weight bits may be employed. In such cases, a corresponding number of compute data storage cells would also be employed.

Compute control circuit 103 is configured to generate, using operand 108, respective voltage levels on compute word line 105 and complement compute word line 106. As described below, the amount of charge coupled to compute bit line 104 may be based on a selected on of the generated voltage levels. In various embodiments, operand 108 may include any suitable number of bits. As described below, compute control circuit 103 may include decode circuits configured to decode operand 108, in order to select one of multiple voltage levels generated by a voltage generator circuit.

Analog-to-digital converter circuit 109 is configured to generate, based on a voltage level of compute bit line 104, output bits 110 whose value is indicative of a product of the operand 108 and a weight value encoded by weight bits 111A-111D. As described below in more detail, analog-to-digital converter circuit 109 may perform a successive approximation or other suitable operation to convert the voltage level of compute bit line 104 to a particular logic value encoded in output bits 110. It is noted that output bits 110 may include any suitable number of bits that may be based, at least in part, on a desired resolution of the product of operand 108 and the weight value encoded by weight bits 111A-111D. With less variability in the voltage level of compute bit line 104 for a particular sum value (resulting from the user of capacitors 112A-D), analog-to-digital converter circuit 109 may be able generate a more accurate digital representation of the sum value of compute bit line 104.

Figure 2:
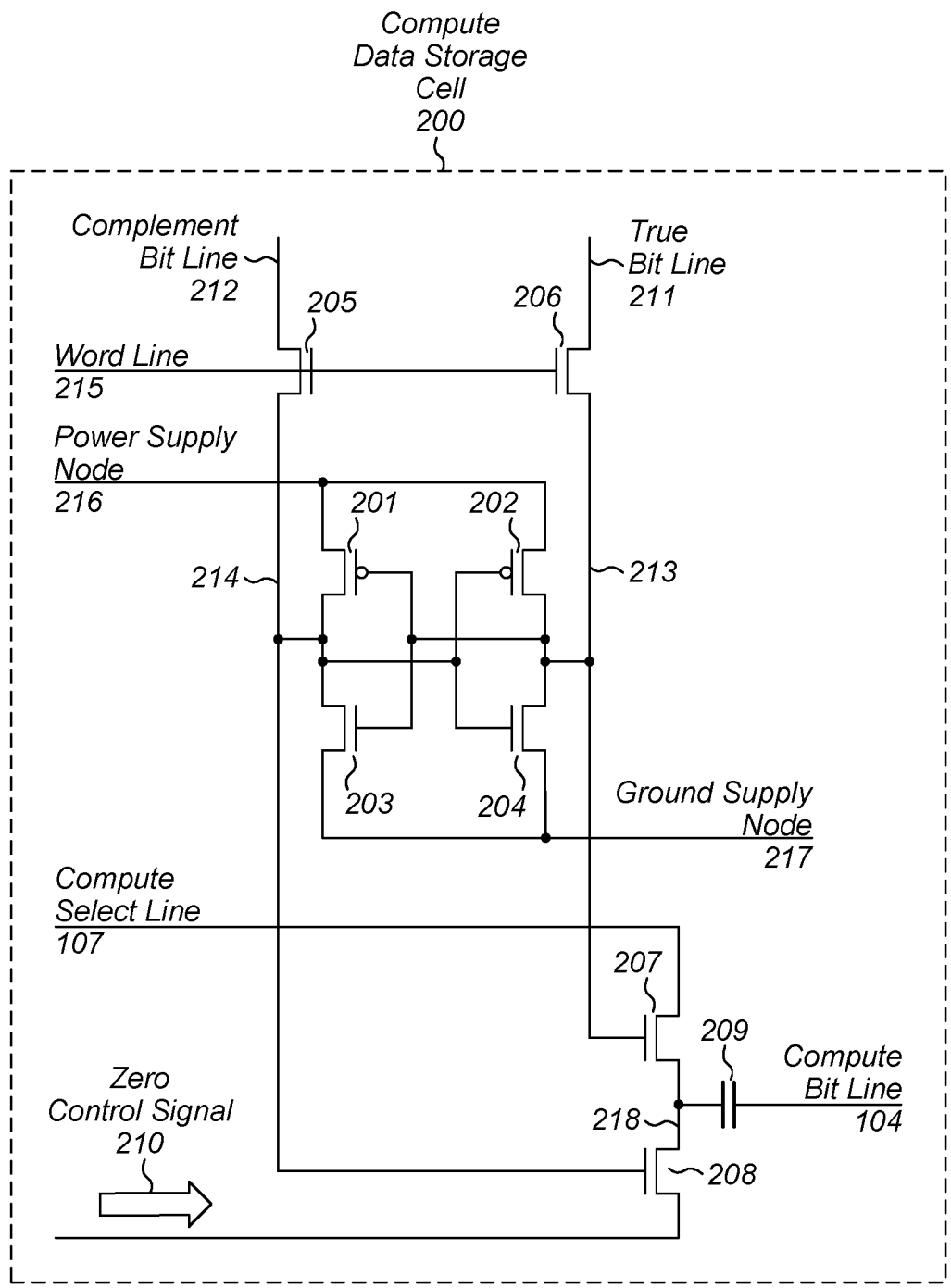
FIG. 2 is a block diagram of an embodiment of a compute data storage cell circuit.

Turning to FIG. 2, an embodiment of a compute data storage cell is depicted. It is noted that compute data storage cell 200 may correspond to any of compute data storage cells 101A-D as depicted in FIG. 1. As illustrated, compute data storage cell 200 includes devices 201-208 and capacitor 209.

Device 201 is coupled between power supply node 216 and node 214, and device 203 is coupled between node 214 and ground supply node 217. Control terminals of both devices 201 and 203 are coupled to node 213. In a similar fashion, device 202 is coupled between power supply node 216 and node 213, and device 204 is coupled between node 213 and ground supply node 217. Control terminals of devices 202 and 204 are coupled to node 214.

In various embodiments, devices 201 and 203 form an inverter circuit, and devices 202 and 204 form another inverter circuit. The two inverter circuits are coupled together in a cross-coupled arrangement that is configured to store data indicated of a particular bit of a weight value. As described below, the particular bit of the weight value may be stored into computer data storage cell 200 using true bit line 211 and complement bit line 212.

Device 205 is coupled between complement line 212 and node 214, while device 206 is coupled between true bit line 211 and node 213. Device 205 is configured to couple, based on the voltage level of word line 215, complement bit line 212 to node 214. In a similar fashion, device 206 is configured to selectively couple, based on the voltage level of word line 215, true bit line 211 to node 213. Since devices 205 and 206 control access to nodes 213 and 214, the devices are often referred to as "pass devices" or "access devices."

As mentioned above, true bit line 211 and complement bit line 212 can be used to store a bit of a weight value into compute data storage cell 200. To store the bit, the value of the bit is differentially encoded in the voltage levels of true bit line 211 and complement bit line 212. When the voltage level of word line 215 is set to a high logic level, devices 205 and 206 activate, coupling complement bit line 212 to node 214, and true bit line 211 to node 213. As the voltage levels of true bit line 211 and complement bit line 212 are transferred to nodes 213 and 214, respectively, the regenerative feedback between devices 201-204 reinforce the change in the voltage levels of nodes 213 and 214. When the voltage level of word line 215 is set to a logical-0 level, devices 205 and 206 are deactivated, de-coupling complement bit line 212 from node 214, and true bit line 211 from node 213. Devices 201-204 maintain the new voltage levels of nodes 213 and 214, thereby storing the bit of the weight value in compute data storage cells 200.

True bit line 211 and complement bit line 212, along with devices 205 and 206, may be used to retrieve (or "read") a value of a bit of a weight value stored in compute data storage cell 200. In various embodiments, true bit line 211 and complement bit line 212 may be pre-charged to a particular voltage level (e.g., the voltage level of power supply node 216). Upon completion of such a pre-charge operation, word line 215 may transition from a logical-0 value to a high logic value, activating devices 205 and 206. One of nodes 213 or 214 may be a logical-0 value, which will reduce the voltage level of either complement bit line 212 or true bit line 211. The small difference in voltage between true bit line 211 and complement bit line 212 may be amplified to determine the value of the bit stored in compute data storage cell 200.

Device 207 is coupled between compute select line 107 and node 218, and is controlled by the voltage level of node 213. In various embodiments, device 207 is configured to couple, based on the voltage level of node 213, compute select line 107 to node 218. For example, when the voltage level of node 213 corresponds to a high logic level, device 207 is active, compute select line 107 is coupled to node 218.

Device 208 is coupled between node 218 and zero control signal 210, and is configured to couple zero control signal 210 to node 218. For example, in response to the voltage level on node 214 corresponding to a high logic level, device 208 is active, coupling zero control signal 210 to node 218.

In various embodiments, a difference between the respective voltage levels of compute bit line 104 and zero control signal 210 determines an amount of charge that is coupled onto compute bit line 104 for a multiplication result of zero. For example, if the voltage level of zero control signal 210 is set to the pre-charge level of compute bit line 104, then no charge will be added to compute bit line when compute select line 107 is activated. Storing no charge for a zero multiplication result results in the largest signal (i.e., the largest change in voltage on compute bit line 104) for non-zero results. In some cases, however, it may be desirable, at the expense of the signal-to-noise ratio of the circuit, to set zero control signal 210 to store a particular amount of charge for use in generating the multiplication result of zero.

Depending on a value of the bit stored in compute data storage cell 200, charge stored in capacitor 209 may be transferred to compute bit line 104 in response to an assertion of compute select line 107. For example, if the voltage level on node 213 corresponds to a high logic level (i.e., the bit value stored in compute data storage cell 200 is a logical-1), device 207 is active. With device 207 active, when the voltage level of compute select line 107 is increased, the voltage level of node 218 also increases. The increase in the voltage level on node 218 couples the charge stored in capacitor 209 into compute bit line 104, resulting in a change in the voltage level of compute bit line 104. Since whether or not compute select line 107 increases in voltage is based on a value of operand 108, the resultant voltage change on compute bit line 104 corresponds to a product of the bit of a weight value stored in compute data storage cell 200 and operand 108. It is noted that when compute data storage cell 200 is storing a logical-0 value, device 207 is inactive and device 208 is active, so the change in voltage of compute bit line 104 is based on a voltage level of zero control signal 210. The change in voltage level, which is some cases may be zero, corresponds to a situation where the product of operand 108 and the bit stored in compute data storage cell 200 is zero.

Capacitor 209 is coupled between node 218 and compute bit line 104, and is configured to couple a particular amount of charge onto compute bit line 104 based, at least in part on, the zero control signal 210, and the respective voltage levels of node 213, node 214, and compute select line 107. The particular amount of charge may correspond to a product of the operand 108 and the bit stored in compute data storage cell 200.

In various embodiments, capacitor 209 may be an embodiment of a metal capacitor formed using metal layers separated by an oxide layer. The use of capacitor 209 to couple charge onto compute bit line 104 allows the amount of charge coupled onto compute bit line to vary naturally with the voltage level of power supply node 216. Moreover, capacitor 209 allows for lower static power consumption and a reduced area compared to using a device to couple charge onto compute bit line 104. As noted above, different instances of 200 may use capacitors of different values. In some cases, instances of data storage cell 200 used to store the bits of a weight value may use capacitors that are weighted in a binary fashion. For example, a capacitor included in a particular data storage cell may be twice the value of a capacitor included in another data storage cell configured to store a next lower significant bit of the weight value.

Devices 203-208 may be implemented as n-channel metal-oxide semiconductor field-effect transistors (MOSFETs), and devices 201 and 202 may be implemented as p-channel MOSFETs. Although the embodiment illustrated in FIG. 2, depicts devices 201-208 as single devices, in other embodiments, any of devices 201-208 may include multiple devices in parallel.

Figure 3:
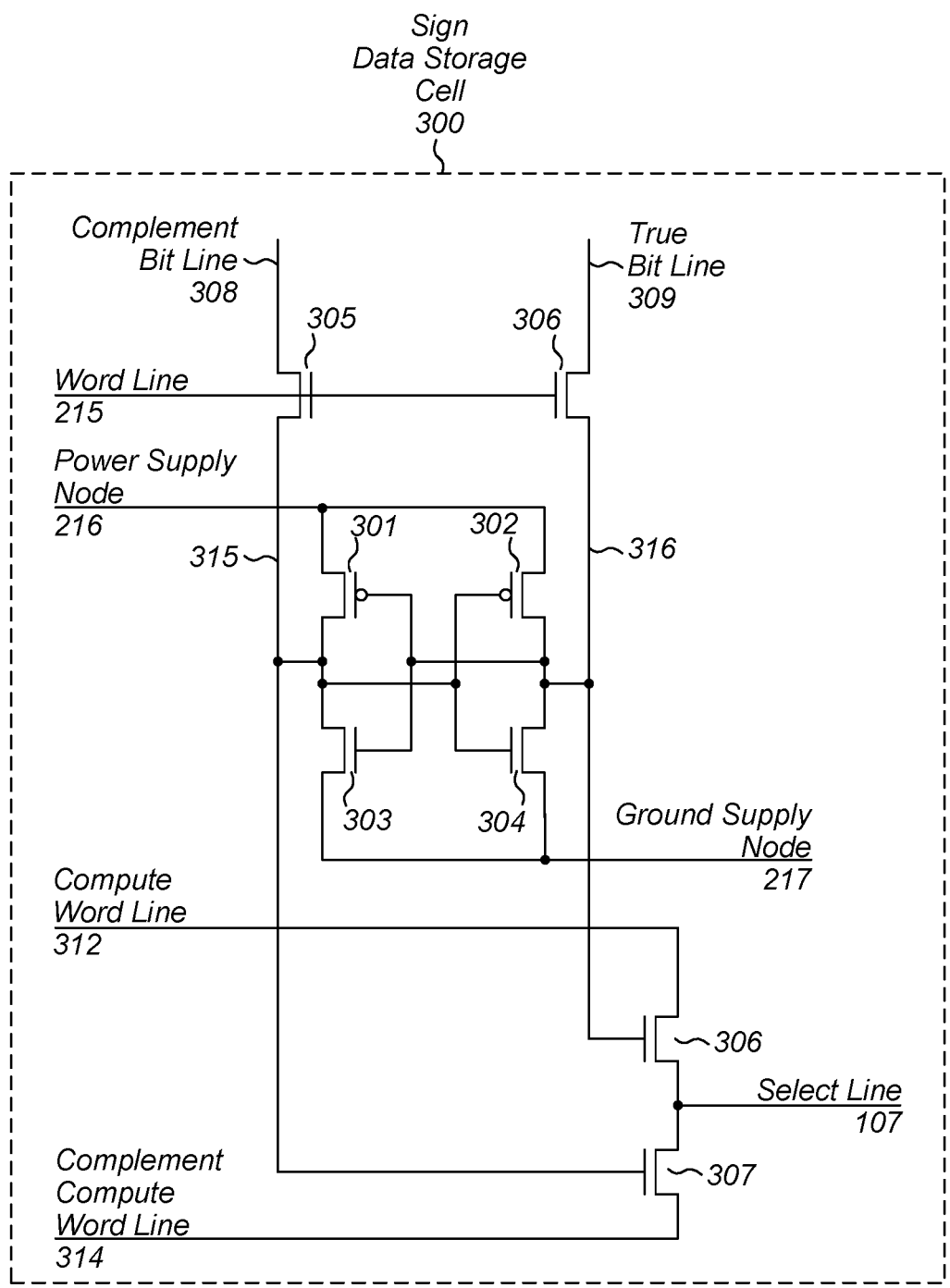
FIG. 3 is a block diagram of an embodiment of a sign data storage cell circuit.

Turning to FIG. 3, an embodiment of a sign data storage cell is depicted. As illustrated, sign data storage cell 120 includes devices 305-307. In various embodiments, devices 301 and 302 may be implemented as p-channel MOSFETs, and devices 303-307 may be implemented as n-channel MOSFETs.

Device 301 is coupled between power supply node 216 and node 315, and device 303 is coupled between node 315 and ground supply node 217. Control terminals of both devices 201 and 203 are coupled to node 316. In a similar fashion, device 302 is coupled between power supply node 216 and node 316, and device 304 is coupled between node 316 and ground supply node 217. Control terminals of devices 202 and 204 are coupled to node 315.

In various embodiments, devices 301 and 303 form an inverter circuit, and devices 302 and 304 form another inverter circuit. The two inverter circuits are coupled together in a cross-coupled arrangement that is configured to store data indicative of a sign bit associated with a particular weight value. As described below, the sign bit may be stored into sign data storage cell 300 using true bit line 309 and complement bit line 308.

Device 305 is coupled between complement bit line 308 and node 315, while device 306 is coupled between true bit line 309 and node 317. Device 305 is configured to selectively couple, based on the voltage level of word line 215, complement bit line 308 to node 315. In a similar fashion, device 306 is configured to selectively couple, based on the voltage level of word line 215, true bit line 309 to node 316. Since devices 305 and 306 control access to nodes 315 and 316, the devices are often referred to as "pass devices" or "access devices."

As mentioned above, true bit line 309 and complement bit line 308 can be used to store sign bit into sign data storage cell 300. To store the sign bit, the value of the bit is differentially encoded in the voltage levels of true bit line 309 and complement bit line 308. When the voltage level of word line 215 is set to a high logic level, devices 305 and 306 activate, coupling complement bit line 308 to node 315, and true bit line 309 to node 316. As the voltage levels of true bit line 309 and complement bit line 308 are transferred to nodes 316 and 315, respectively, the regenerative feedback between devices 301-304 reinforce the change in the voltage levels of nodes 315 and 316. When the voltage level of word line 215 is set to a logical-0, devices 305 and 306 are deactivated, de-coupling complement bit line 212 from node 214, and true bit line 211 from node 213. The regenerative feedback of devices 301-304 maintaining the new voltage levels of nodes 315 and 316, thereby storing the sign bit in sign data storage cell 300.

True bit line 309 and complement bit line 308, along with devices 305 and 306, may be used to retrieve (or "read") a value of the sign bit stored in sign data storage cell 300. In various embodiments, true bit line 309 and complement bit line 308 may be pre-charged to a particular voltage level (e.g., the voltage level of power supply node 216). Upon completion of such a pre-charge operation, word line 215 may transition from a logical-0 value to a high logic value, activating devices 305 and 306. One of nodes 315 or 316 may be a logical-0 value, which will reduce the voltage level of either complement bit line 308 or true bit line 309. The small difference in voltage between true bit line 309 and complement bit line 308 may be amplified to determine the value of the sign bit stored in sign data storage cell 300.

Device 306 is coupled between compute word line 312 and select line 107, and device 307 is coupled between complement compute word line 314 and select line 107. A control terminal of device 306 is coupled to node 316, and a control terminal of device 307 is coupled to node 315. Device 307 is configured to selectively couple, based on a voltage level of node 315, complement compute word line 314 to select line 107. Device 306 is configured to selectively couple, based on a voltage level of node 316, compute word line 312 to select line 107.

During a compute operation, the voltage levels of compute word line 312 and complement compute word line 314 are set by compute control circuit 103. Based upon a value of the sign bit stored in sign data storage cell 300, either compute word line 312 or complement compute word line 314 is coupled to select line 107. For example, if the value of the sign bit stored in sign data storage cell 300 is a logical-1, then the voltage level of node 316 corresponds to a high logic value, and the voltage level of node 315 corresponds to a logical-0 value. The high logic value on node 316 activates device 306, coupling compute word line 312 to select line 107. The logical-0 value on node 315 deactivates device 307, preventing complement compute word line 314 from coupling to select line 107. If sign data storage cell 300 is storing a logical-0 value, then device 306 is inactive and device 307 is active, coupling complement compute word line 314 to select line 107.

Figure 4:
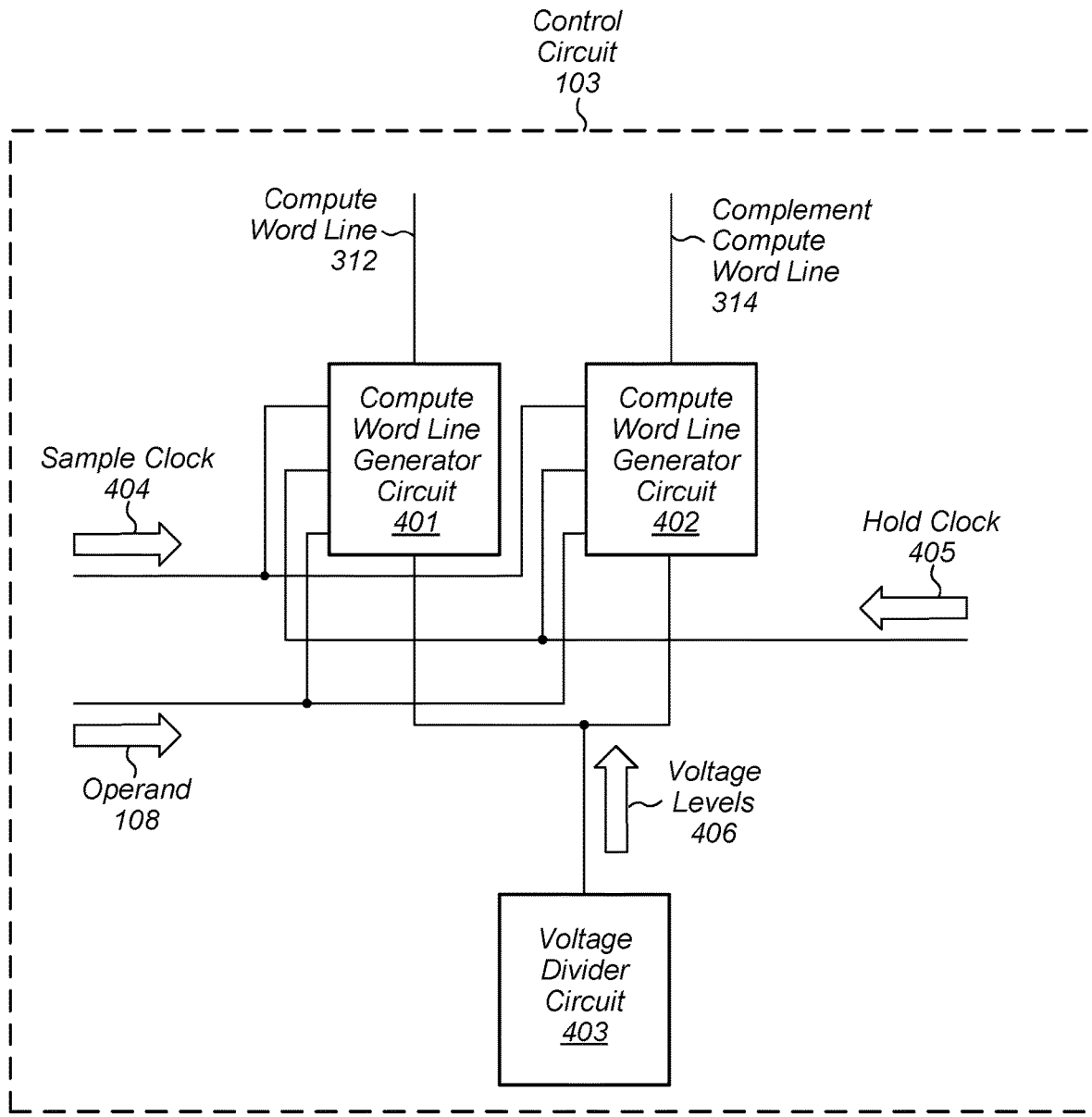
FIG. 4 is a block diagram of an embodiment of a control circuit.

Turning to FIG. 4, an embodiment of control circuit 103 is depicted. As illustrated, control circuit 103 includes compute word line generator circuit 401, compute word line generator circuit 402, and voltage divider circuit 403.

Compute word line generator circuit 401 is configured to selectively generate a signal on compute word line 312 using sample clock 404, operand 108, hold clock 405, and voltage levels 406. As described below, compute word line generator circuit 401 may select, based on operand 108, different ones of voltage levels 406 when sample clock 404 is asserted. In various embodiments, compute word line generator circuit 401 is configured to pre-charge compute word line 312 to a particular voltage level, in response to an assertion of hold clock 405.

Compute word line generator circuit 402 is configured to generate a signal on complement compute word line 314. In various embodiments, compute word line generator circuit 402 functions in a similar fashion to compute word line generator circuit 402, however the logic circuits of compute word line generator circuit 402 are a complement of compute word line generator circuit 401, resulting in the signal on complement compute word line 314 being a logical inverse of the signal on compute word line 312.

Voltage divider circuit 403 is configured to generate voltage levels 406. In various embodiments, voltage levels 406 may include any suitable number of voltage levels. For example, in some embodiments, 15 different voltage levels are included in voltage levels 406. As described below, voltage divider circuit 403 may employ a resistive voltage divider or other suitable circuit that uses a voltage level of a power supply node to generate the different ones of voltage levels 406.

Figure 5:
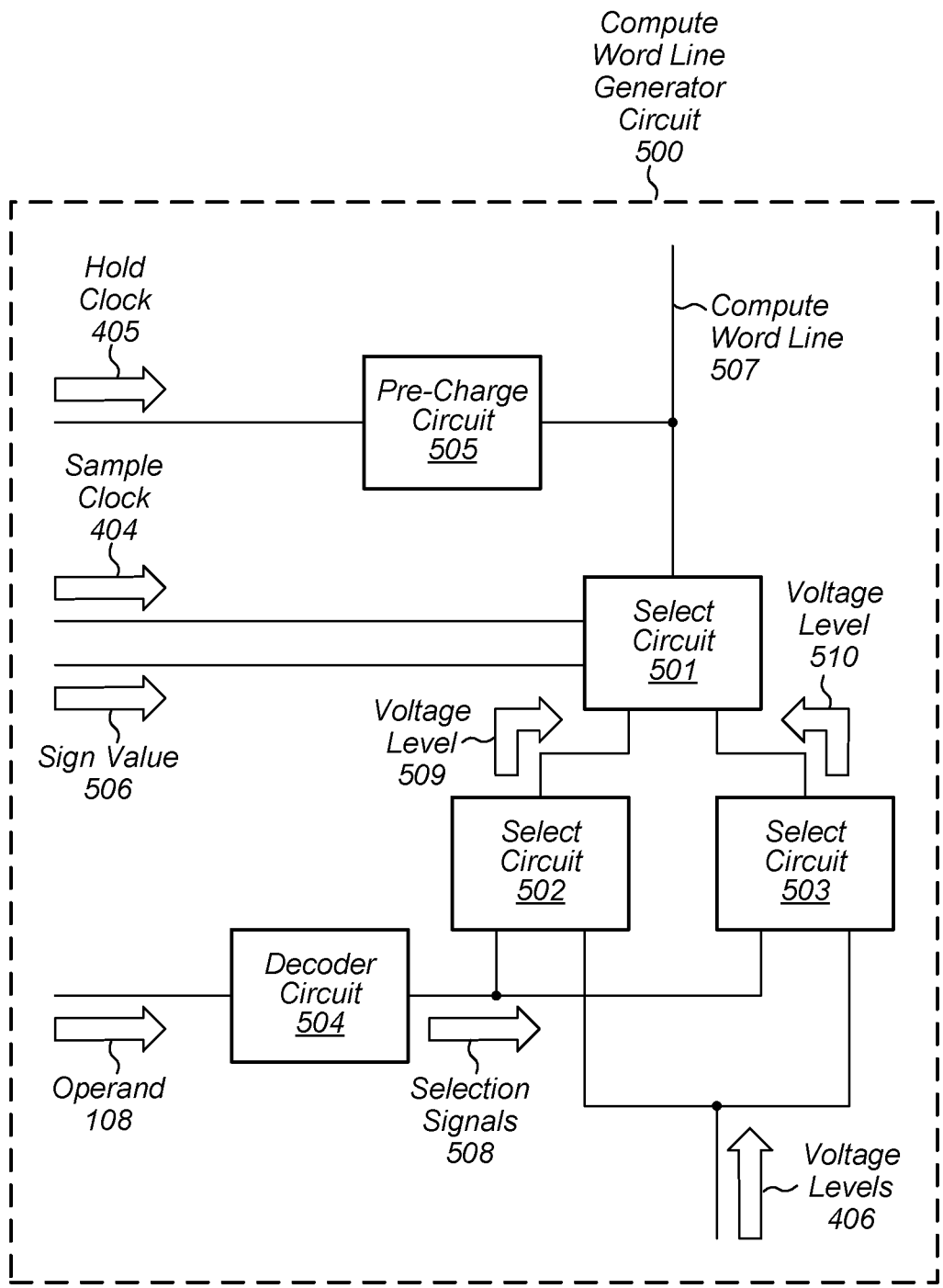
FIG. 5 is a block diagram of an embodiment of a compute word line generator circuit.

Turning to FIG. 5, an embodiment of a compute word line generator circuit 500 is depicted. As illustrated, compute word line generator circuit 500 includes select circuits 501-503, decoder circuit 504, and pre-charge circuit 505. In various embodiments, compute word line generator circuit 500 may correspond to either of compute word line generator circuits 401 and 402 as depicted in FIG. 4.

As described below in more detail, pre-charge circuit 505 is configured to set compute word line 507 to a particular voltage level using hold clock 405. For example, in response to an assertion of hold clock 405, pre-charge circuit 505 may set compute word line 507 to a particular voltage level for a particular value of sign value 506, or set compute word line 507 to a different voltage level for a different value of sign value 506.

Decoder circuit 504 is configured to generate selection signals 508 using operand 108. In various embodiments, decoder circuit 504 may include any suitable combination of logic circuits configured to assert a particular one of selection signals 508 based on a value of operand 108. In various embodiments, each possible value of operand 108 may be mapped to a corresponding one of selection signals 508.

Select circuit 502 is configured to select one of voltage levels 406 to generate voltage level 509. In various embodiments, select circuit 502 may include multiple pass devices configured to activate in response to an assertion of a corresponding one of selection signals 508. In a similar fashion, select circuit 503 may include multiple pass devices, and is configured to select a different one of voltage levels 406 using selection signals 508 to generate voltage level 510. Although the topology of select circuits 502 and 503 are similar, in various embodiments, the connections of either voltage levels 406 or selection signals 508 may be different so that select circuit 502 selects a different one of voltage levels 406 that does select circuit 503 for a particular value of operand 108.

Select circuit 501 is configured to selectively couple, using sample clock 404 and sign value 506, one of voltage level 509 or voltage level 510 onto compute word line 507. As described below in more detail, in response to an assertion of sample clock 404, select circuit 501 is further configured selectively couple, based on a value of sign value 506, one of voltage level 509 or voltage level 510 to compute word line 507. For example, when sign value 506 is a low or logical-0 value, select circuit 501 may be configured to couple voltage level 509 to compute word line 507. Alternatively, when sign value 506 is a high or logical-1 value, select circuit 501 may be configured to couple voltage level 510 to compute word line 507.

Figure 6:
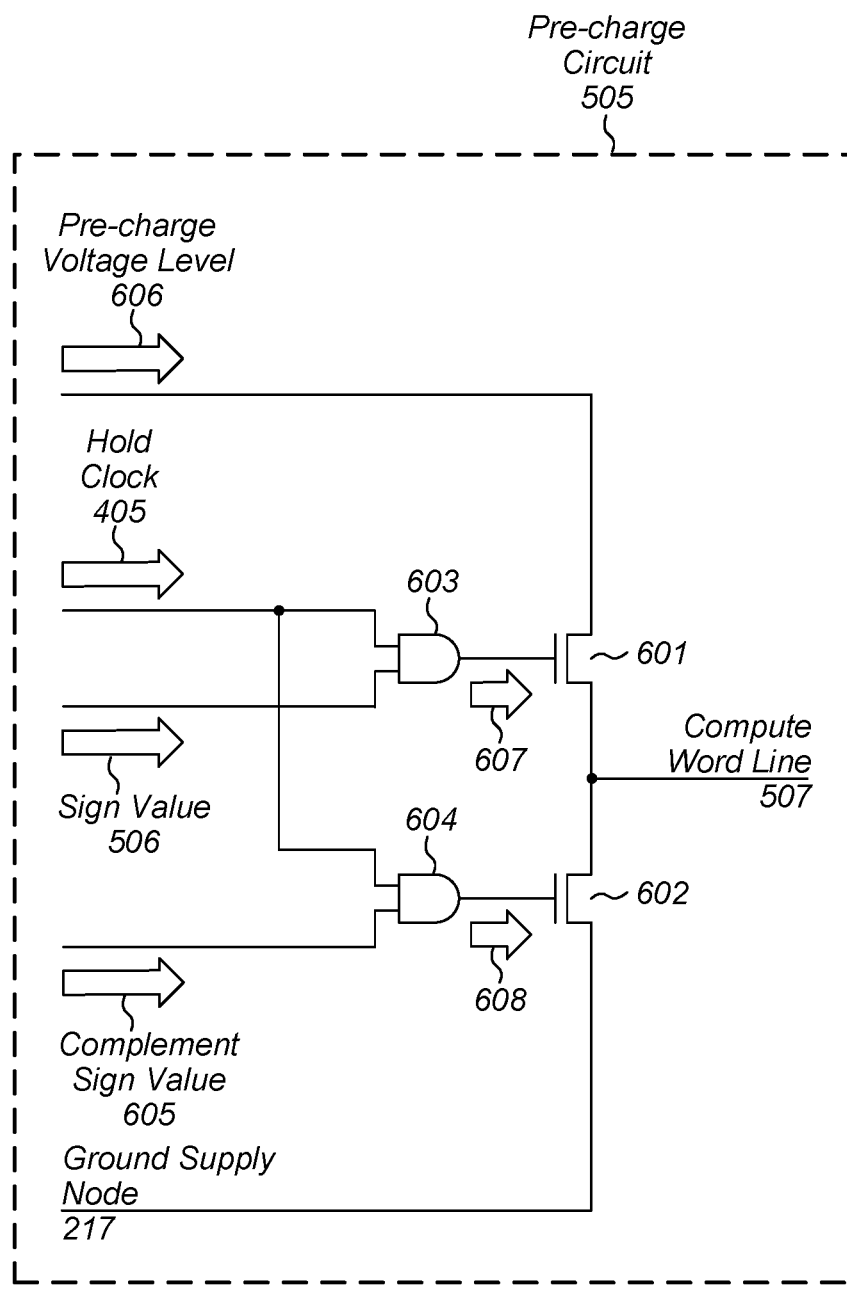
FIG. 6 is a block diagram of an embodiment of a pre-charge circuit.

Turning to FIG. 6, a block diagram of an embodiment of pre-charge circuit 505 is depicted. As illustrated, pre-charge circuit 505 includes devices 601 and 602, and gates 603 and 604.

Device 601 is coupled to compute word line 507, and is configured to selectively couple, based on signal 607, pre-charge voltage level 606 to compute word line 507. For example, in response to an assertion of signal 607, device 601 may couple pre-charge voltage level 606 to compute word line 507, thereby pre-charging compute word line 507. In various embodiments, device 601 is an embodiment of an n-channel MOSFET or other suitable transconductance device. It is noted that although device 601 is depicted in FIG. 6 as a single device, in other embodiments, any suitable number of devices may be used to implement device 601.

Device 602 is coupled between compute word line 507 and ground supply node 217, and is configured to couple, based on signal 608, compute word line 507 to ground supply node 217. In various embodiments, device 602 is an embodiment of an n-channel MOSFET or other suitable transconductance device. It is noted that although device 602 is depicted in FIG. 6 as a single device, in other embodiments, any suitable number of devices may be used to implement device 602.

AND gate 603 is configured to generate signal 607 using hold clock 405 and sign value 506. In various embodiments, AND gate 603 is configured to generate signal 607 such that a logic value of signal 607 is the logical AND of the respective values of hold clock 405 and sign value 506. For example, in response to a determination that respective values of hold clock 405 and sign value 506 are both logical-1s, AND gate 603 will set signal 607 to a logical-1 value, which enables device 601, allowing compute word line 507 to charge to pre-charge voltage level 606.

AND gate 604 is configured to generate signal 608 using hold clock 405 and complement sign value 605. In various embodiments, AND gate 604 is configured to generate signal 608 such that a logic value of signal 608 is the logical AND of the respective values of hold clock 405 and complement sign value 506. For example, in response to a determination that respective values of hold clock 405 and complement sign value 506 are both logical-1s, AND gate 604 will set signal 608 to a logical-1 value, which enables device 602, discharging compute word line 507 to the voltage level of ground supply node 217.

AND gates 603 and 604 may be implemented as CMOS logic gates configured to perform a logical AND operation of its input signals to generate an output signal. In some cases, AND gates 603 and 604 may include multiple logic gates (e.g., a NAND gate and an inverter), or any other suitable combination of devices configured to implement the logical AND function.

Figure 7:
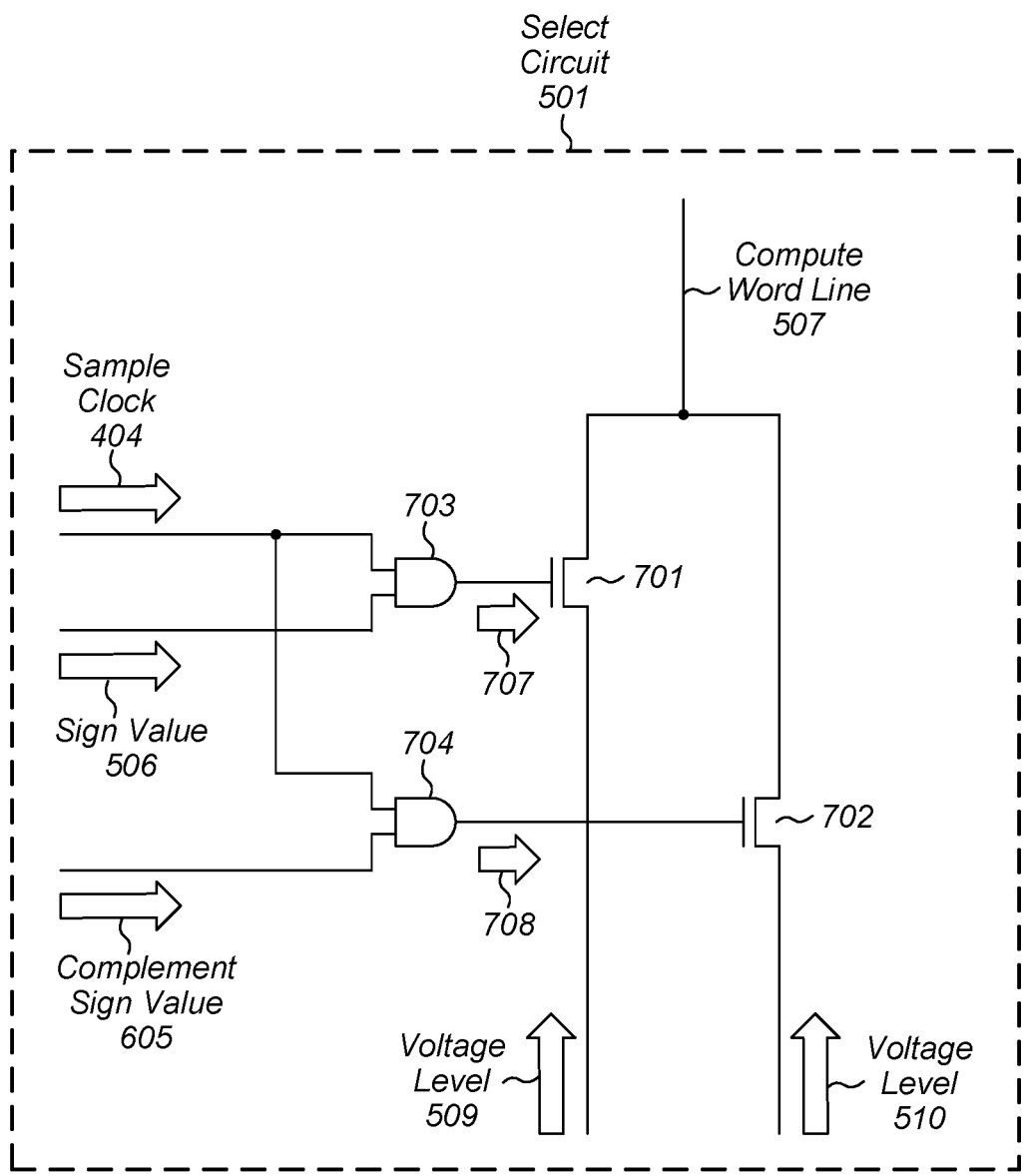
FIG. 7 is a block diagram of an embodiment of select circuit.

Turning to FIG. 7, a block diagram of an embodiment of select circuit 501 is depicted. As illustrated, select circuit 501 includes devices 701 and 702, and gates 703 and 704.

Device 701 is coupled to compute word line 507, and is configured to selectively couple, based on signal 707, voltage level 509 to compute word line 507. For example, in response to an assertion of signal 707, device 701 may couple voltage level 509 to compute word line 507, thereby setting compute word line 507 to voltage level 509. In various embodiments, device 701 is an embodiment of an n-channel MOSFET or other suitable transconductance device. It is noted that although device 701 is depicted in FIG. 7 as a single device, in other embodiments, any suitable number of devices may be used to implement device 701.

Device 702 is coupled to compute word line 507 and is configured to couple, based on signal 708, compute word line 507 to voltage level 510. In various embodiments, device 702 is an embodiment of an n-channel MOSFET or other suitable transconductance device. It is noted that although device 702 is depicted in FIG. 7 as a single device, in other embodiments, any suitable number of devices may be used to implement device 702.

AND gate 703 is configured to generate signal 707 using sample clock 404 and sign value 506. In various embodiments, AND gate 703 is configured to generate signal 707 such that a logic value of signal 707 is the logical AND of the respective values of sample clock 404 and sign value 506. For example, in response to a determination that respective values of sample clock 404 and sign value 506 are both logical-1s, AND gate 703 will set signal 707 to a logical-1 value, which enables device 701, setting compute word line 507 to voltage level 509.

AND gate 704 is configured to generate signal 708 using sample clock 404 and complement sign value 605. In various embodiments, AND gate 704 is configured to generate signal 708 such that a logic value of signal 708 is the logical AND of the respective values of sample clock 404 and complement sign value 605. For example, in response to a determination that respective values of sample clock 404 and complement sign value 605 are both logical-1s, AND gate 704 will set signal 708 to a logical-1 value, which enables device 702, setting compute word line 507 to voltage level 510.

AND gates 703 and 704 may be implemented as CMOS logic gates configured to perform a logical AND operation of its input signals to generate an output signal. In some cases, AND gates 703 and 704 may include multiple logic gates (e.g., a NAND gate and an inverter), or any other suitable combination of devices configured to implement the logical AND function.

Figure 8:
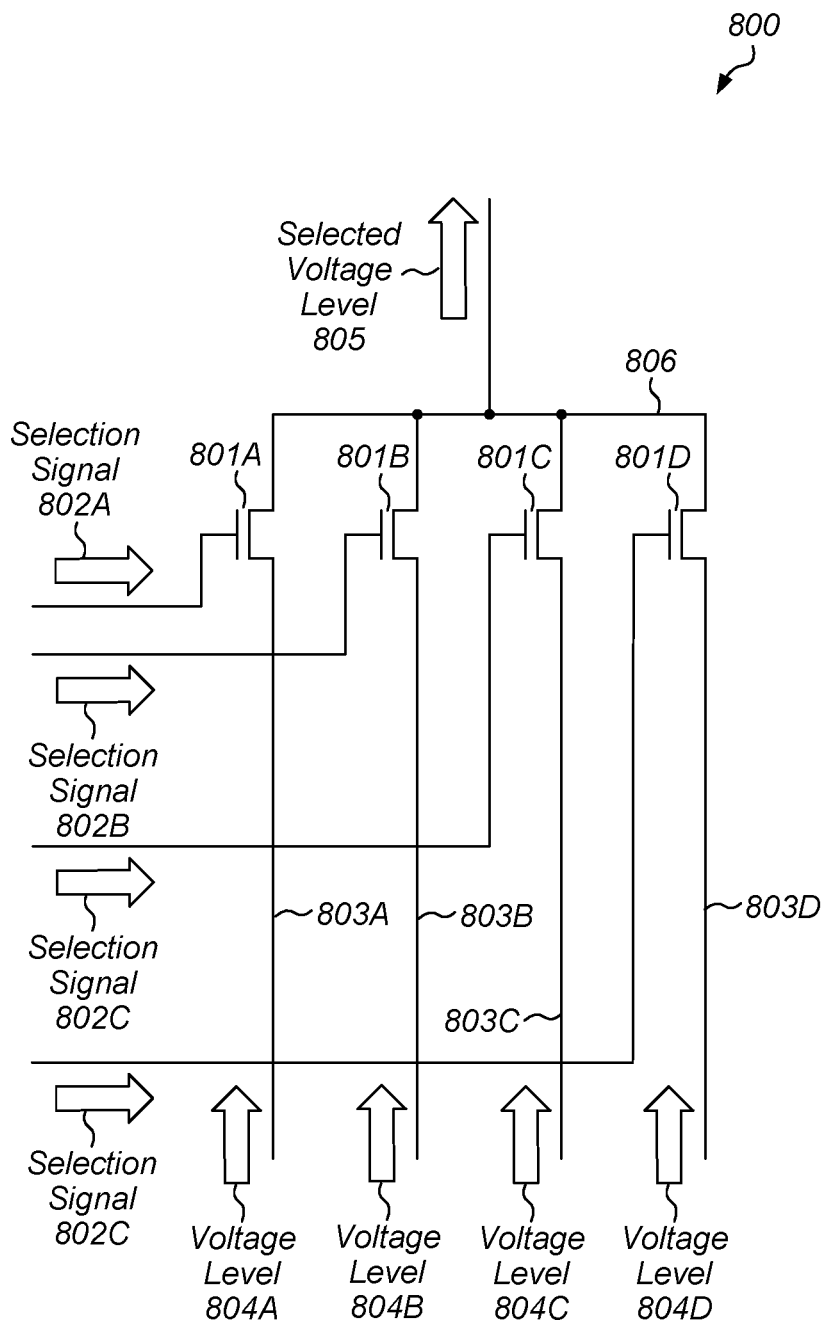
FIG. 8 is a block diagram of another embodiment of a select.

Turning to FIG. 8, an embodiment of a select circuit is depicted. As illustrated, select circuit 800 includes devices 801A-D, and may correspond to either of select circuits 502 or 503 as depicted in the embodiment of FIG. 5. Although only four devices are depicted in the embodiment of FIG. 4, in other embodiments, and suitable number of devices may be employed.

Device 801A is coupled between node 806 and node 803A, and is configured to couple, based on selection signal 802A, voltage level 804A onto node 806 to generate selected voltage level 805. In a similar fashion, device 801B is coupled between node 806 and node 803B, and is configured to couple, based on selection signal 802B, voltage level 804B onto node 806 to generate selected voltage level 805.

Device 801C is coupled between node 806 and node 803C, and is configured to couple, based on selection signal 802C, voltage level 804C onto node 806 to generate selected voltage level 805. In a similar fashion, device 801D is coupled between node 806 and node 803D, and is configured to couple, based on selection signal 802D, voltage level 804D onto node 806 to generate selected voltage level 805.

Voltage levels 804A-D may, in various embodiments, be included in voltage levels 406 as depicted in the embodiment of FIG. 4. Selection signals 802A-D may, in various embodiments, be included in selection signals 508 as depicted in FIG. 5. It is noted that, in some cases, selection signals 802A-D may be mutually exclusive, i.e., only one of selection signals 802A-D may be asserted at a time.

Devices 801A-D may be implemented as n-channel MOSFETs or other suitable transconductance devices. Although each of devices 801A-D are depicted as a single device, in other embodiments, any of devices 801A-D may include any suitable number of devices coupled together in parallel.

Figure 9:
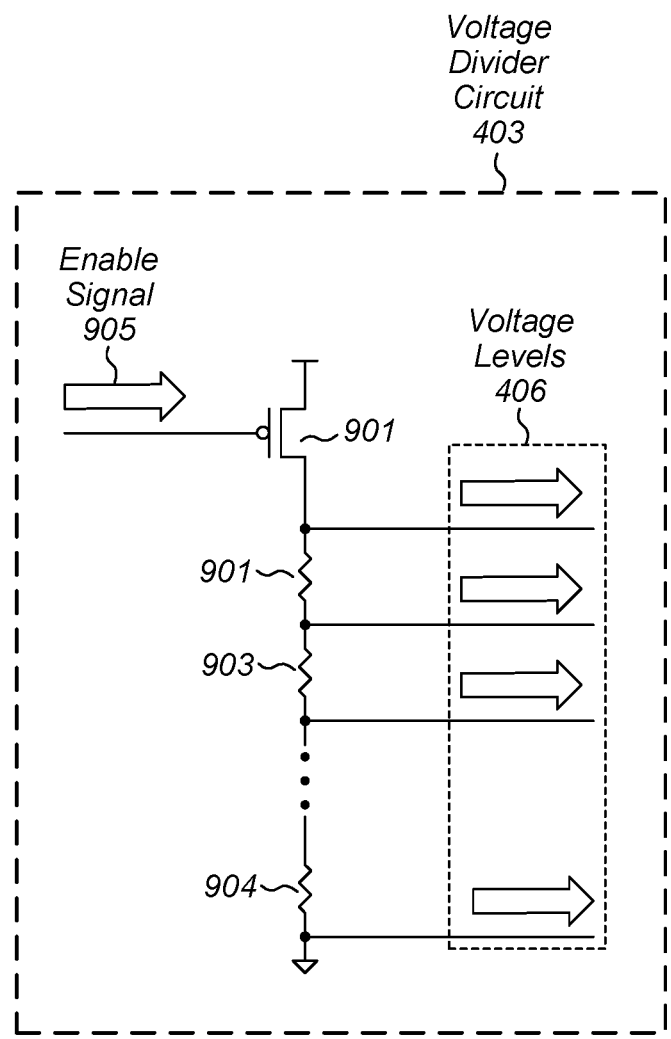
FIG. 9 is a block diagram of an embodiment of a voltage divider circuit.

Voltage levels 406 may be generated using a variety of circuit techniques. One such circuit technique is depicted in the embodiment of FIG. 9. As illustrated, voltage divider circuit 403 includes device 901, and resistors 902-904.

Resistors 902-904 are coupled between device 901 and a ground supply node. Resistors 902-904 may be fabricated from metal, polysilicon, or any other suitable material available on a semiconductor manufacturing process. It is noted that although only three resistors are depicted in the embodiment of FIG. 9, in other embodiments, any suitable number of resistors may be employed.

Device 901 is coupled between a power supply node and the series combination of resistors 902-904, and is controlled by enable signal 905. In various embodiments, device 901 may be an embodiment of a p-channel MOSFET configured to conduct current from the power supply node to the series combination of resistors 902-904 when enable signal 905 is at a logical-0 level.

As current flows from the power supply node via device 901 into the series combination of resistors 902-904, a voltage drop is developed across each of resistors 902-904. The voltage drop across a given on of resistors 902-904 corresponds to a particular one of voltage levels 406. When enable signal 905 is at a high logic level, device 901 is disabled, resulting in a high impedance between the power supply node and the series combination of resistors 902-904, thereby preventing any current flow through resistors 902-904. With no current flow, each of voltage levels 406 may drop to a voltage level at or near ground potential.

Figure 10:
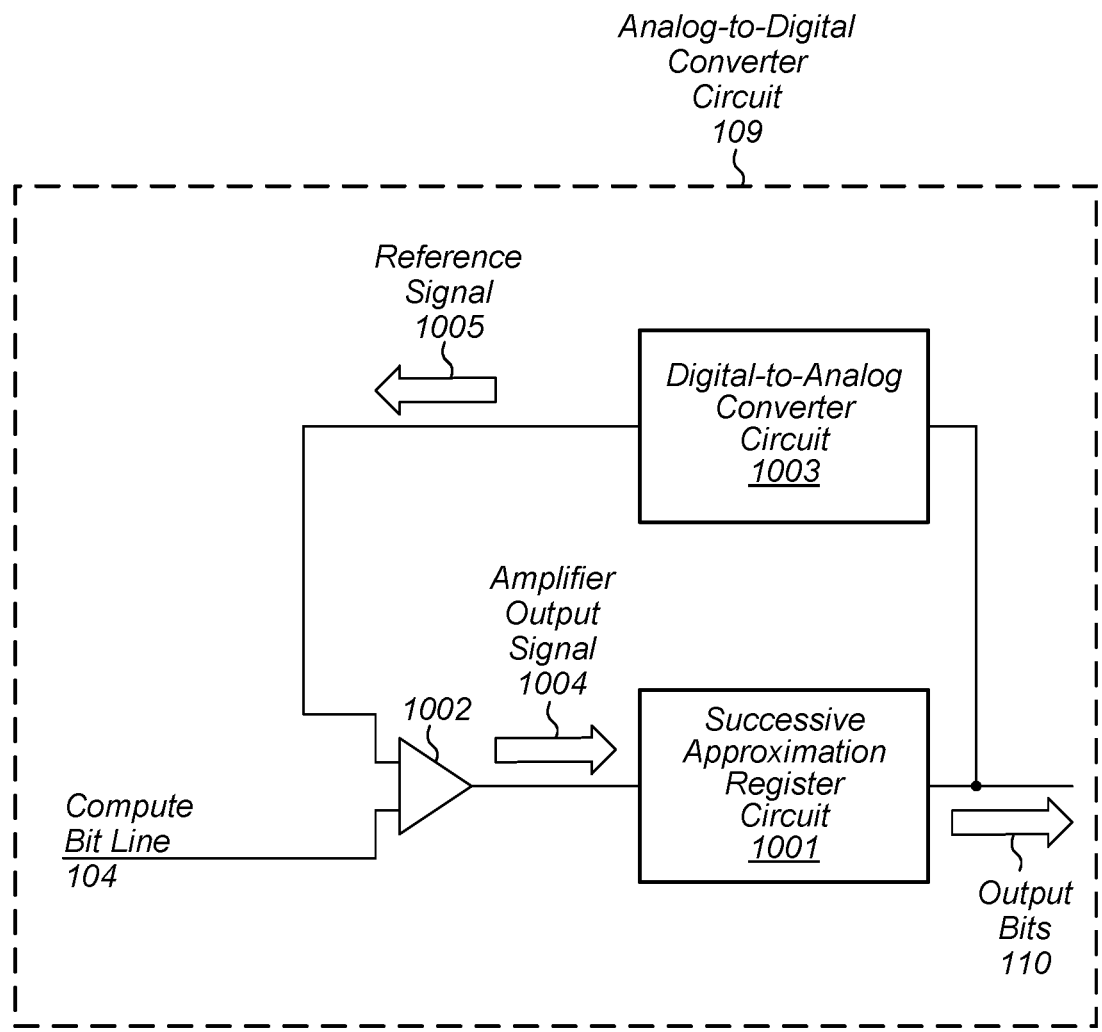
FIG. 10 is a block diagram of an embodiment of an analog-to-digital converter circuit.

Turning to FIG. 10, a block diagram of analog-to-digital converter circuit 109 is depicted. As illustrated, analog-to-digital converter circuit 109 includes successive approximation register circuit 1001, amplifier circuit 1002, and digital-to-analog converter circuit 1003.

Amplifier circuit 1002 may, in various embodiments, be an embodiment of a differential amplifier configured to generate amplifier output signal 1004 using a voltage level of compute bit line 104 and reference signal 1005. In some embodiments, amplifier circuit 1002 may be configured to compare the voltage level of compute bit line 104 to reference signal 1005 in order to determine a particular logic level for amplifier output signal 1004. For example, if the voltage level of compute bit line 104 is less than reference signal 1005, then amplifier circuit 1002 may be configured to set amplifier output signal 1004 to a logical-1 value.

Successive approximation register circuit 1001 is configured to generate output bits 110 using amplifier output signal 1004. In various embodiments, successive approximation register circuit 1001 may be an embodiment of a sequential logic circuit configured, based on a particular value of amplifier output signal 1004, to increase or decrease the value of output bits 110 according to one of various algorithms. For example, successive approximation register circuit 1001 may change the value of outputs bits 110 according to a binary search algorithm. Successive approximation register circuit 1001 may include any suitable number of bits, and may also employ a clock signal (not shown) in conjunction with amplifier output signal 1004 to increment and decrement the value of output bits 110.

Digital-to-analog converter circuit 1003 is configured to generate reference signal 1005 using output bits 110. In various embodiments, the digital-to-analog converter circuit 1003 may be configured to determine a voltage level of reference signal 1005 based on a value of output bits 110. For example, in some cases, the larger the value of the number represented by output bits 110, the greater the voltage level of reference signal 1005.

When compute-memory circuit 100 initiates a compute operation, successive approximation register circuit 1001 may initialize the output bits 110 to a particular value. Digital-to-analog converter circuit 1003 may then determine the voltage level of reference signal 1005 based on the value of output bits 110. Amplifier circuit 1102 may then compare reference signal 1005 to the voltage level of compute bit line 104. Successive approximation register circuit 1001 may then increase or decrease the value of output bits 110 using results of the comparison of the voltage level of compute bit line 104 and reference signal 1005. The process may continue, with successive approximation register circuit 1001 modifying the value of output bits 110 until reference signal 1005 is within a threshold value of the voltage level of compute bit line 104, at which point the value of output bits 110 represents the voltage level of compute bit line 104, and therefore, the product of operand 108 and the weight value that includes weight bits 103A-103D.

Figure 11:
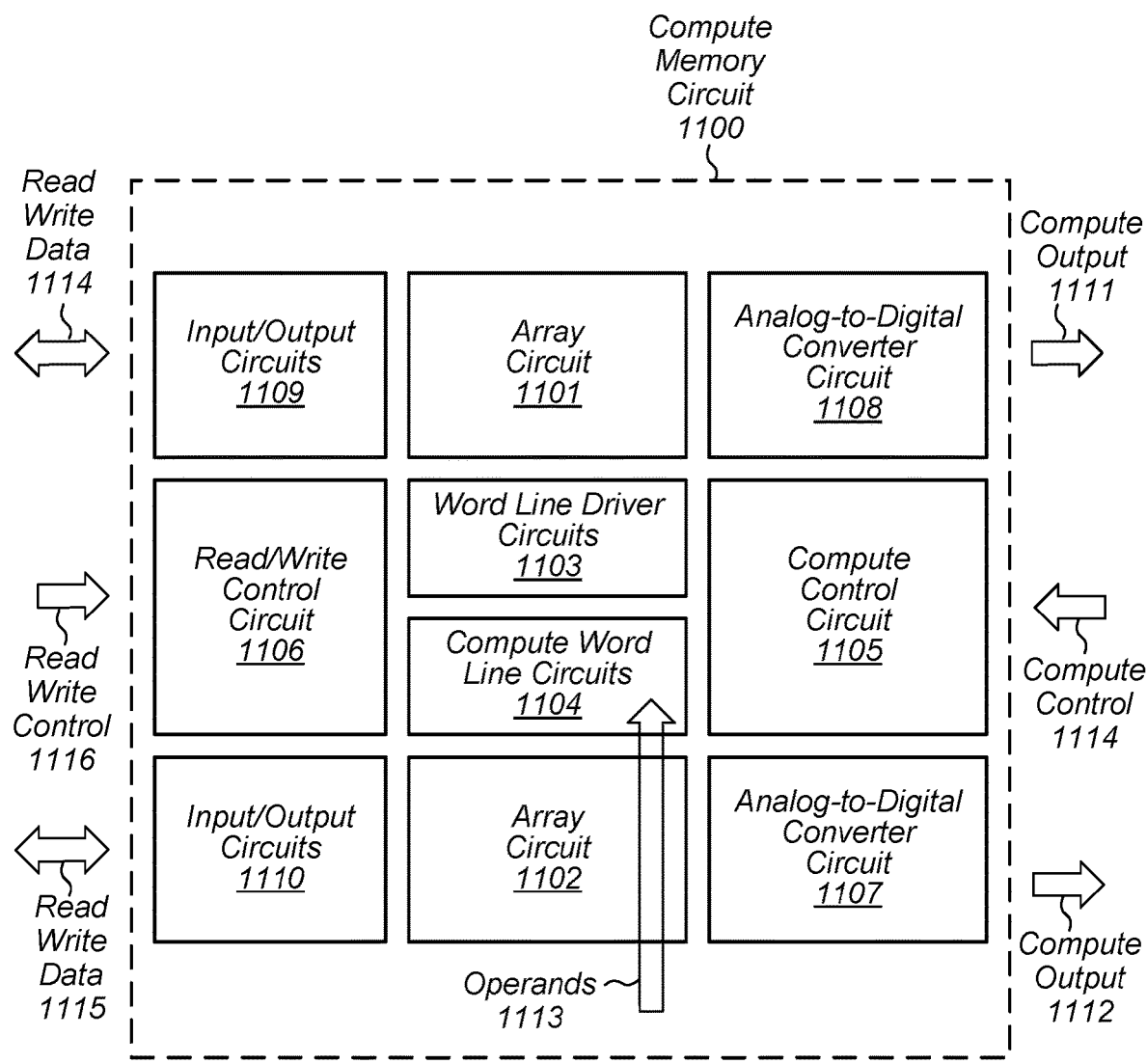
FIG. 11 is a block diagram of another embodiment of a compute-memory circuit.

Another embodiment of a compute-memory circuit is depicted in FIG. 11. As illustrated, compute-memory circuit 1100 includes array circuits 1101 and 1102, word line driver circuits 1103, compute word line circuits 1104, compute control circuit 1105, read/write control circuit 1106, analog-to-digital converter circuits 1107 and 1108, and input/output circuits 1109 and 1110.

As described below in more detail, array circuits 1101 and 1102 may include multiple compute data storage cells 200 and sign data storage cells 300. Array circuits 1101 and 1102 are coupled to word line driver circuits 1103 and compute word line circuits 1104. Additionally, the true and complement bit lines of the compute and sign data storage cells included in array circuits 1101 and 1102 are coupled to input/output circuits 1109 and 1110, respectively.

Compute word line circuits 1104 may correspond to control circuit 103 as depicted in FIG. 1. In various embodiments, compute word line circuits 1104 are configured to generate compute word lines (e.g., compute word line 105) and complement compute word lines (e.g., complement compute word line 106) using operands 1113.

Word line driver circuits 1103 are configured to generate word line signals (e.g., word line 215) using signals from read/write control circuit 1106. In various embodiments, such word lines are used to store weight information in data storage cells included in array circuits 1101 and 1102. In some cases, word line driver circuits 1103 are configured to decode address information (not shown) to generate the word line signals.

Analog-to-digital converter circuits 1108 and 1109 may, in various embodiments, include multiple ones of analog-to-digital converter circuit 109 as depicted in FIGS. 1 and 7. In some embodiments, analog-to-digital converter circuits 1108 and 1109 may be configured to generate compute output 1111 and compute output 1112, respectively, using data from array circuit 1101 and 1102.

Input/output circuit 1109 is configured to receive read write data 1114, and input/output circuit 1110 is configured to receive read write data 1115, respectively, and temporarily store the received data until it is stored in the compute data storage cells and sign data storage cells included in array circuits 1101 and 1102. In various embodiments, read write data 1114 and 1115 may include weights use for in-memory compute operations. Additionally, input/output circuits 1109 and 1110 may be configured to output data read from array circuits 1101 and 1102. Such read data may be used to verify that the sign and weight values have been correctly stored in the compute and sign data storage cells of array circuit 1101. In various embodiments, input/output circuits 1109 and 1110 may include any suitable combination of latch circuits, sense amplifier circuits, write driver circuits, and the like.

Read/write control circuit 1106 is configured to generate, using read write control 1116, timing signals (not shown) used by input/output circuits 1109 and 1110 to write data to and read data from array circuits 1101 and 1102. In various embodiments, read/write control circuit 1106 may include any suitable combination of combinatorial and sequential logic circuits.

Figure 12:
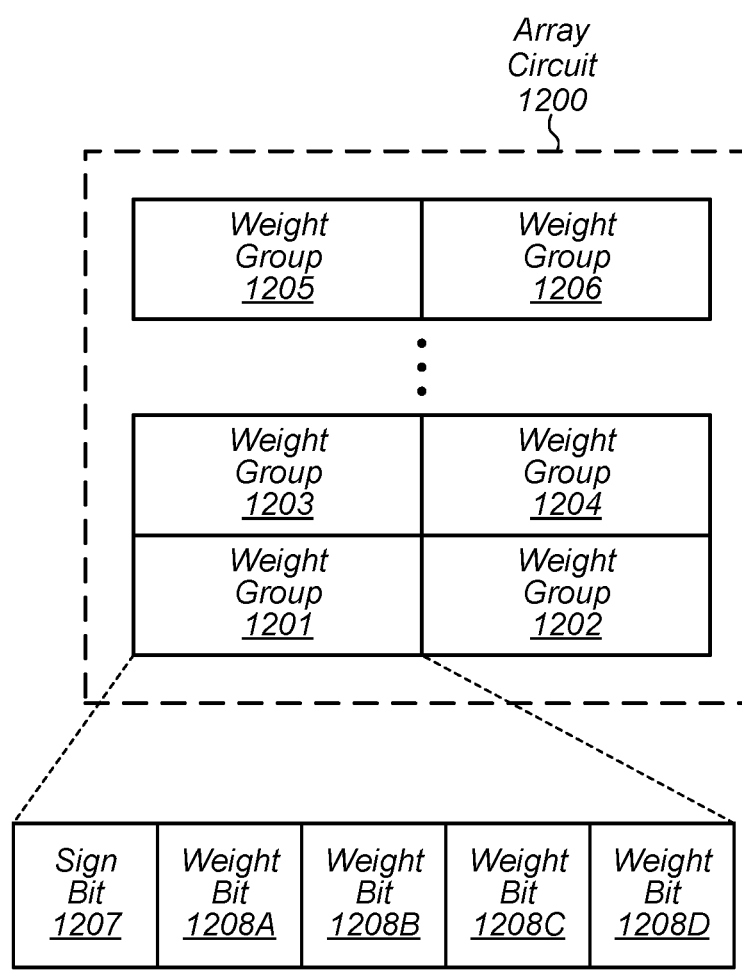
FIG. 12 is a block diagram of an embodiment of an array circuit included in a compute-memory circuit.

Turning to FIG. 12, a block diagram of array circuit 1200 is depicted. In various embodiments, array circuit 1200 may correspond to either of array circuits 1101 and array circuits 1102 as depicted in FIG. 11. As illustrated, array circuit 1200 includes weight group 1201-1206. Although only five weight groups are depicted in array circuit 1200, in other embodiments, any suitable number of weight groups may be employed.

Each of weight groups 1201-1205 may include multiple data storage cells, such as those described above, configured to store sign and weight. For example, weight group 1201 includes sign bit 1207 and weight bits 1208A-1208D. In various embodiments, sign bit 1207 may correspond to sign data storage cell 300 as depicted in FIG. 3, and weight bits 1208A-1208D may correspond to compute data storage cell 200 as depicted in FIG. 2. It is noted that although only 4 weight bits are depicted in weight group 1201, in other embodiments, any suitable number of weight bits may be employed.

Figure 13:
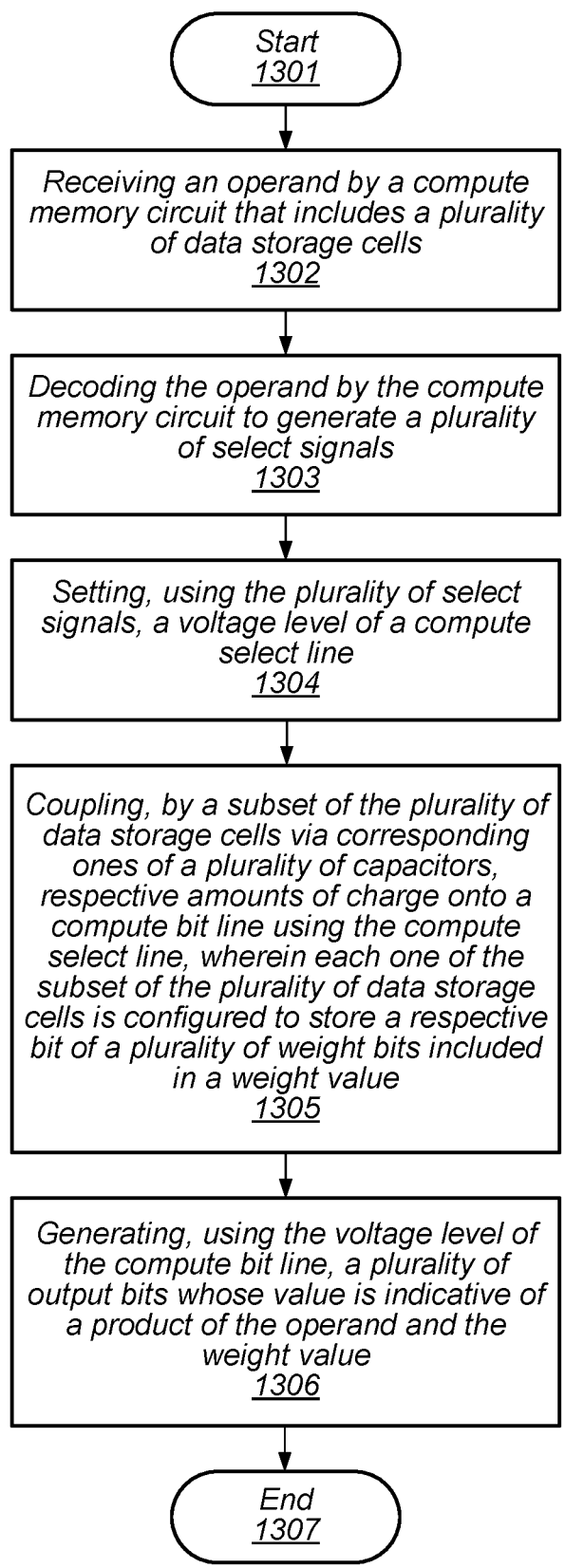
FIG. 13 depicts a flow diagram illustrating an embodiment of a method for operating a compute-memory circuit.

Turning to FIG. 13, a flow diagram depicting an embodiment of a method for operating a compute-memory is illustrated. The method, which begins in block 1301, may be applied to various compute-memory circuits, including compute-memory circuit 1100 as depicted in FIG. 11.

The method includes receiving an operand by a compute-memory circuit that includes a plurality of data storage cells (block 1302). In various embodiments, the operand may include any suitable number of bits that may be set of respective logical values (e.g., logical-1). In some cases, the operand may be a signed value, in which case one of the bits included in the operand corresponds to a sign of the operand.

The method further includes decoding, by the compute-memory circuit, the operand to generate a plurality of select signals (block 1303). In various embodiments, decoding the operand may include latching the bits included in the operand, and generating complement values of the latched bits.

The method also includes setting, using the plurality of select signals, a voltage level of a compute select line (block 1304). In some cases, the method further includes generating, by a voltage divider circuit, a plurality of voltage levels. In various embodiments, setting the voltage level of the compute select line includes selecting a first voltage level of the plurality of voltage levels for a compute word line using a first clock signal and a first sign bit associated with the operand, and selecting a second voltage level of the plurality of voltage levels for a complement compute word line using the first clock signal and the first sign bit value.

Setting the voltage level of the compute select line may further include selectively coupling either the compute word line or the complement compute word line to the compute select lines using a second sign bit associated with the weight value. In various embodiments, the method may also include pre-charging the compute word line and the complement compute word line to respective voltage levels using a second clock signal different that the first clock signal.

The method further includes coupling, by a subset of the plurality of data storage cells, a respective amounts of charge onto a compute bit line using the compute select line, wherein the subset of the plurality of data storage cells is configured to store respective bits of a plurality of weight bits included in a weight value (block 1305). In some embodiments, coupling, the respective amounts of charge onto the compute bit line includes coupling, by a first data storage cell of the subset of the plurality of data storage cells, a first amount of charge using a first capacitor coupled to the compute bit line, and coupling, by a second data storage cell of the subset of the plurality of data storage cells, a second amount of charge using a second capacitor coupled to the compute bit line, where a value of the second capacitor is greater than a value of the first capacitor. In various embodiments, the value of the first capacitor is twice the value of the second capacitor.

The method also includes generating, using the voltage level of the compute bit line, a plurality of output bits whose value is indicative of a product of the operand and the weight value (block 1306). The method may further include setting an initial voltage level on the compute bit line prior to receiving the operand. The method concludes in block 1307.

Figure 14:
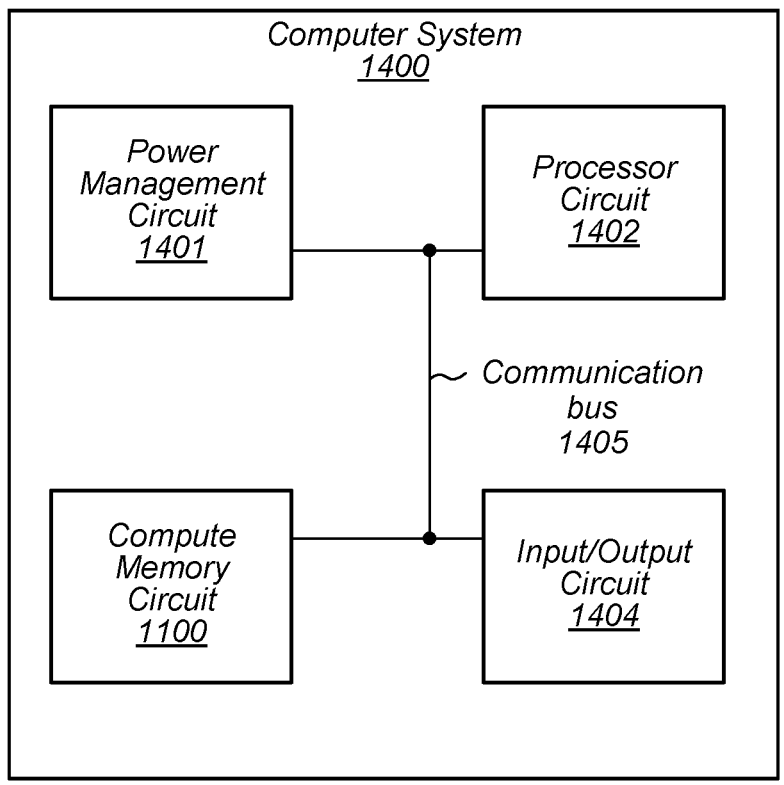
FIG. 14 illustrates a block diagram of a computer system.

A block diagram of computer system is illustrated in FIG. 14. In the illustrated embodiment, the computer system 1400 includes power management circuit 1401, processor circuit 1402, compute-memory circuit 1100, and input/output circuits 1404, each of which is coupled to communication bus 1405. In various embodiments, computer system 1400 may be a system-on-a-chip (SoC) and/or be configured for use in a desktop computer, server, or in a mobile computing application such as, e.g., a tablet, laptop computer, or wearable computing device.

Power management circuit 1401 is configured to provide power to processor circuit 1402, compute-memory circuit 1100, and input/output circuits 1404. In various embodiments, power management circuit 1401 includes one or more power converter circuits configured to generate regulated voltage levels on power supply nodes internal to computer system 1400. In some cases, power management circuit 1401 may generate respective regulated voltage levels for processor circuit 1402, compute-memory circuit 1100, and input/output circuit 1404.

Processor circuit 1402 may, in various embodiments, be representative of a general-purpose processor that performs computational operations. For example, processor circuit 1402 may be a central processing unit (CPU) such as a microprocessor, a microcontroller, an application-specific integrated circuit (ASIC), or a field-programmable gate array (FPGA).

As described above, compute-memory circuit 1100 may be configured to perform in-memory compute functions. In various embodiments, compute-memory circuit 1100 may be configured to store a matrix of weight values and generate a product of the weight values and an operand value. Compute-memory circuit 1100 may be configured to send the result to processor circuit 1402 or input/output circuit 1404 using communication bus 1405. It is noted that although in a single compute-memory circuit is illustrated in FIG. 14, in other embodiments, any suitable number of compute-memory circuits may be employed.

Input/output circuits 1404 may be configured to coordinate data transfer between computer system 1400 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, input/output circuits 1404 may be configured to implement a version of Universal Serial Bus (USB) protocol or IEEE 1394 (Firewire®) protocol.

Input/output circuits 1404 may also be configured to coordinate data transfer between computer system 1400 and one or more devices (e.g., other computing systems or integrated circuits) coupled to computer system 1400 via a network. In one embodiment, input/output circuits 1404 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, input/output circuits 1404 may be configured to implement multiple discrete network interface ports.

The present disclosure includes references to "embodiments," which are non-limiting implementations of the disclosed concepts. References to "an embodiment," "one embodiment," "a particular embodiment," "some embodiments," "various embodiments," and the like do not necessarily refer to the same embodiment. A large number of possible embodiments are contemplated, including specific embodiments described in detail, as well as modifications or alternatives that fall within the spirit or scope of the disclosure. Not all embodiments will necessarily manifest any or all of the potential advantages described herein.

Unless stated otherwise, the specific embodiments are not intended to limit the scope of claims that are drafted based on this disclosure to the disclosed forms, even where only a single example is described with respect to a particular feature. The disclosed embodiments are thus intended to be illustrative rather than restrictive, absent any statements to the contrary. The application is intended to cover such alternatives, modifications, and equivalents that would be apparent to a person skilled in the art having the benefit of this disclosure.

Particular features, structures, or characteristics may be combined in any suitable manner consistent with this disclosure. The disclosure is thus intended to include any feature or combination of features disclosed herein (either explicitly or implicitly), or any generalization thereof. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

For example, while the appended dependent claims are drafted such that each depends on a single other claim, additional dependencies are also contemplated, including the following: Claim 9 (could depend from any of claims 7-8); claim 10-11 (could depend from any of claims 7-9); etc. Where appropriate, it is also contemplated that claims drafted in one statutory type (e.g., apparatus) suggest corresponding claims of another statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to the singular forms such as "a," "an," and "the" are intended to mean "one or more" unless the context clearly dictates otherwise. Reference to "an item" in a claim thus does not preclude additional instances of the item.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," covering x but not y, y but not x, and both x and y.

On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one of element of the set [w, x, y, z], thereby covering all possible combinations in this list of elements. This phrase is not to be interpreted to require that there is at least one instance of w, at least one instance of x, at least one instance of y, and at least one instance of z.

Various "labels" may proceed nouns in this disclosure. Unless context provides otherwise, different labels used for a feature (e.g., "first circuit," "second circuit," "particular circuit," "given circuit," etc.) refer to different instances of the feature. The labels "first," "second," and "third" when applied to a particular feature do not imply any type of ordering (e.g., spatial, temporal, logical, etc.), unless stated otherwise.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical). More specifically, this formulation is used to indicate that this structure is arranged to perform the one or more tasks during operation. A structure can be said to be "configured to" perform some task even if the structure is not currently being operated. Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to," An unprogrammed FPGA, for example, would not be considered to be "configured to" perform some specific function. This unprogrammed FPGA may be "configurable to" perform that function, however.

Reciting in the appended claims that a structure is "configured to" perform one or more tasks is expressly intended not to invoke 35 U.S.C. § 112(f) for that claim element. Should Applicant wish to invoke Section 112(f) during prosecution, it will recite claim elements using the "means for" [performing a function] construct.

The phrase "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

What is claimed is:

1. An apparatus, comprising:
a sign data storage cell configured to:
store a sign value associated with a weight value; and
couple, based on the sign value, either a compute word line or a complement compute word line to a compute select line;
a plurality of compute data storage cells, wherein a given compute data storage cell includes a capacitor, and wherein the given compute data storage cell is configured to:
store a corresponding bit of the weight value; and
couple, based on the corresponding bit and a voltage level of the compute select line, a respective amount of charge onto a compute bit line via the capacitor;
a control circuit configured to generate, using an operand value, respective voltage levels on the compute word line and the complement compute word line; and
an analog-to-digital converter circuit configured to generate, based on a voltage level of the compute bit line, a plurality of output bits whose value is indicative of a product of the operand value and the weight value.

2. The apparatus of claim 1, wherein the control circuit further includes a voltage divider circuit including a plurality of resistors, wherein the voltage divider circuit is configured to generate a plurality of voltage levels.

3. The apparatus of claim 2, wherein the control circuit further includes a decoder circuit configured to decode the operand value to generate a plurality of selection signals.

4. The apparatus of claim 3, wherein the control circuit further includes:
a first selection circuit configured to select a first voltage level of the plurality of voltage levels using the plurality of selection signals;
a second selection circuit configured to select a second voltage level of the plurality of voltage levels using the plurality of selection signals; and
a third selection circuit configured to selectively couple, using a first clock signal and the sign value, the compute word line to either the first voltage level or the second voltage level.

5. The apparatus of claim 1, wherein a value of a first capacitor included in a first compute data storage cell of the plurality of compute data storage cells is twice a value of a second capacitor included in a second compute data storage cell of the plurality of compute data storage cells.

6. The apparatus of claim 1, wherein the analog-to-digital converter circuit includes a device configured to pre-charge the compute bit line to a particular voltage.

7. A method, comprising:
receiving an operand by a compute-memory circuit that includes a plurality of data storage cells;
decoding, by the compute-memory circuit, the operand to generate a plurality of select signals;
setting, using the plurality of select signals, a voltage level of a compute select line;

coupling, by a subset of the plurality of data storage cells via corresponding ones of a plurality of capacitors, a respective amounts of charge onto a compute bit line using the compute select line, wherein each one of the subset of the plurality of data storage cells is configured to store a respective bit of a plurality of weight bits included in a weight value; and generating, using a voltage level of the compute bit line, a plurality of output bits whose value is indicative of a product of the operand and the weight value.

8. The method of claim 7, further comprising, generating, by a voltage divider circuit, a plurality of voltage levels.

9. The method of claim 8, wherein setting the voltage level of the compute select line includes:

selecting a first voltage level of the plurality of voltage levels for a compute word line using a first clock signal and a first sign bit value associated with the operand;

selecting a second voltage level of the plurality of voltage levels for a complement compute word line using the first clock signal and the first sign bit value; and selectively coupling either the compute word line or the complement compute word line to the compute select line using a second sign bit value associated with the weight value.

10. The method of claim 9, further comprising, pre-charging the compute word line and the complement compute word line to respective voltage levels using a second clock signal different than the first clock signal.

11. The method of claim 7, wherein coupling, by a subset of the plurality of data storage cells, the respective amounts of charge onto the compute bit line includes:

coupling by a first data storage cell of the subset of the plurality of data storage cells a first amount of charge using a first capacitor coupled to the compute bit line; and coupling by a second data storage cell of the subset of the plurality of data storage cells a second amount of charge using a second capacitor coupled to the compute bit line, wherein a value of the second capacitor is greater than a value of the first capacitor.

12. The method of claim 11, wherein the value of the first capacitor is twice the value of the second capacitor.

13. The method of claim 7, further comprising, setting an initial voltage level on the compute bit line prior to receiving the operand.

14. An apparatus, comprising:

a processor circuit;

a compute-memory circuit coupled to the processor circuit, wherein the compute-memory circuit includes a plurality of data storage cells, and wherein the compute-memory circuit is configured to:

receive an operand from the processor circuit;

decode the operand to generate a plurality of select signals;

set a voltage level of a compute select line using the plurality of select signals;

couple, via a plurality of capacitors included in a subset of the plurality of data storage cells, respective amounts of charge onto a compute bit line using the compute select line and data stored in the subset of the plurality of data storage cells, wherein the data is indicative of a weight value; and generate an output value using a voltage level of the compute bit line, wherein the output value is indicative of a product of the operand and the weight value.

15. The apparatus of claim 14, wherein the compute-memory circuit is further configured to generate a plurality of voltage levels.

16. The apparatus of claim 15, wherein to set the voltage level of the compute select line, the compute-memory circuit is further configured to:

select a first voltage level of the plurality of voltage levels for a compute word line using a first clock signal and a first sign bit value associated with the operand;

select a second voltage level from the plurality of voltage levels for a complement compute word line using the first clock signal and the first sign bit value; and selectively couple either the compute word line or the complement compute word line to the compute select line using a second sign bit value associated with the weight value.

17. The apparatus of claim 16, wherein the compute-memory circuit is further configured to pre-charge the compute word line and the complement compute word line to respective voltage levels using the first sign bit value, and a second clock signal different than the first clock signal.

18. The apparatus of claim 14, wherein the subset of the plurality of data storage cells includes a first data storage cell and a second data storage cell, wherein the first data storage cell includes a first capacitor, wherein the second data storage cell includes a second capacitor, and wherein to couple respective amounts of charge onto the compute bit line, the compute-memory circuit is further configured to:

couple the first capacitor to the compute bit line; and couple the second capacitor coupled to the compute bit line, wherein a value of the second capacitor is greater than a value of the first capacitor.

19. The apparatus of claim 18, wherein a value of the first capacitor is twice the value of the second capacitor.

20. The apparatus of claim 14, wherein the compute-memory circuit is further configured to:

receive an address value and the weight value from the processor circuit; and store the weight value into the subset of the plurality of data storage cells using the address value.

* * * * *

UNITED STATES PATENT AND TRADEMARK OFFICE
CERTIFICATE OF CORRECTION

PATENT NO. : 12,333,357 B2  
APPLICATION NO. : 17/317844  
DATED : June 17, 2025  
INVENTOR(S) : Michael A. Dreesen et al.

Page 1 of 1

It is certified that error appears in the above-identified patent and that said Letters Patent is hereby corrected as shown below:

In the Claims

In Column 19 (Claim 7), Lines 2-3, please delete "capacitors, a respective" and insert -- capacitors, respective --.

Signed and Sealed this  
Twelfth Day of August, 2025

Coke Morgan Stewart  
*Acting Director of the United States Patent and Trademark Office*